United States Patent
Samson et al.

(10) Patent No.: US 9,712,168 B1
(45) Date of Patent: Jul. 18, 2017

(54) PROCESS VARIATION POWER CONTROL IN THREE-DIMENSIONAL (3D) INTEGRATED CIRCUITS (ICS) (3DICS)

(71) Applicant: QUALCOMM Incorporated, San Diego, CA (US)

(72) Inventors: Giby Samson, San Diego, CA (US); Yu Pu, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/264,983

(22) Filed: Sep. 14, 2016

(51) Int. Cl.
  *H03B 1/00* (2006.01)
  *H03K 3/00* (2006.01)
  *H03K 19/003* (2006.01)
  *H03K 3/03* (2006.01)
  *G06F 17/50* (2006.01)

(52) U.S. Cl.
  CPC ... *H03K 19/00369* (2013.01); *G06F 17/5068* (2013.01); *H03K 3/0315* (2013.01)

(58) Field of Classification Search
  USPC .................. 327/538, 530, 540, 541
  See application file for complete search history.

(56) References Cited

U.S. PATENT DOCUMENTS

| 8,006,212 | B2 | 8/2011 | Sinha et al. |
| 8,490,042 | B2 | 7/2013 | Gao |
| 8,681,524 | B1 | 3/2014 | Stephens, Jr. |
| 8,754,672 | B2 | 6/2014 | Dennard et al. |
| 8,913,443 | B2 | 12/2014 | Pyeon |
| 8,930,875 | B2 | 1/2015 | Yin |
| 9,256,246 | B1 | 2/2016 | Lim et al. |
| 2007/0244676 | A1 | 10/2007 | Shang et al. |
| 2010/0231286 | A1* | 9/2010 | Kuusilinna ............ G01K 7/425 327/512 |
| 2015/0022262 | A1* | 1/2015 | Du ........................... H01L 21/77 327/565 |
| 2015/0077173 | A1* | 3/2015 | Goodnow ........... H01L 25/0657 327/530 |
| 2015/0110158 | A1* | 4/2015 | Liu .......................... G01K 7/21 374/184 |
| 2015/0348962 | A1* | 12/2015 | Chao .................... H01L 23/5283 257/207 |
| 2016/0087918 | A1* | 3/2016 | Cheng ................. G06F 17/5063 370/400 |

(Continued)

*Primary Examiner* — Adam Houston
(74) *Attorney, Agent, or Firm* — Withrow & Terranova, PLLC

(57) ABSTRACT

Systems and methods for process variation power control in three-dimensional integrated circuits (3DICs) are disclosed. In an exemplary aspect, at least one process variation sensor is placed in each tier of a 3DIC. The process variation sensors report information related to a speed characteristic for elements within the respective tier to a decision logic. The decision logic is programmed to weight output from the process variation sensors according to relative importance of logic path segments in the respective tiers. The weighted outputs are combined to generate a power control signal that is sent to a power management unit (PMU). By weighting the importance of the logic path segments, a compromise voltage may be generated by the PMU which is "good enough" for all the elements in the various tiers to provide acceptable performance.

20 Claims, 7 Drawing Sheets

(56) References Cited

U.S. PATENT DOCUMENTS

| | | | |
|---|---|---|---|
| 2016/0140276 A1* | 5/2016 | Sarhan | G06F 17/5045 716/103 |
| 2016/0197069 A1* | 7/2016 | Morrow | H01L 21/82343 257/393 |
| 2016/0293227 A1* | 10/2016 | Chi | G11C 5/063 |
| 2016/0301400 A1 | 10/2016 | Savidis et al. | |
| 2016/0322331 A1* | 11/2016 | Lim | H01L 23/5286 |

\* cited by examiner

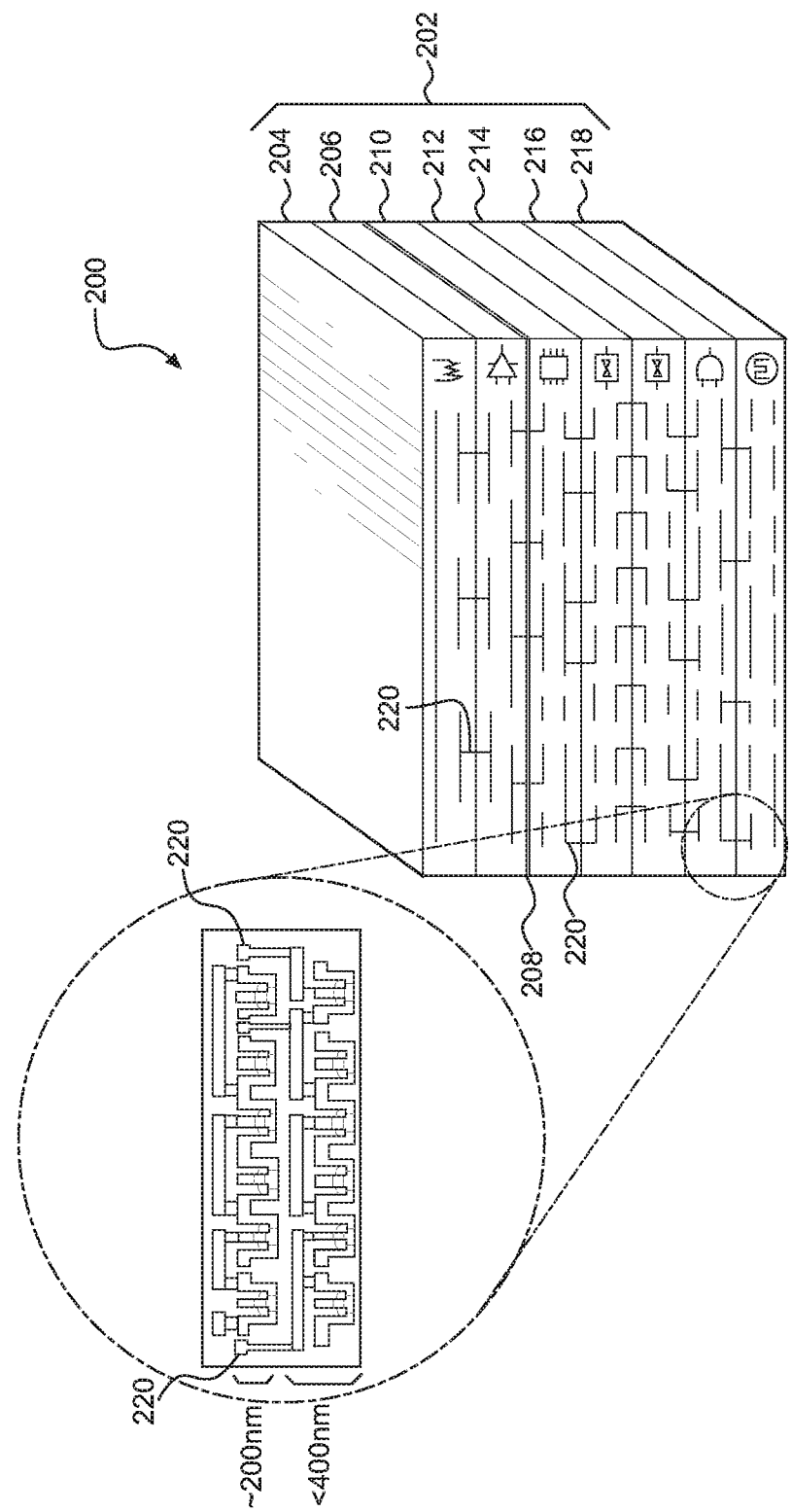

PROCESS VARIATION POWER CONTROL IN THREE-DIMENSIONAL (3D) INTEGRATED CIRCUITS (ICS) (3DICS)

BACKGROUND

I. Field of the Disclosure

The technology of the disclosure relates generally to power control and more particularly to power control in a three-dimensional (3D) integrated circuit (IC) (3DIC).

II. Background

Computing devices have become common in modern society. The rise in numbers of computing devices is due, in part, to the advent of truly portable or mobile computing devices. While such mobile computing devices began as relatively cumbersome and bulky devices that exhausted batteries relatively quickly, increased miniaturization and power saving techniques have made current devices into powerful multimedia devices with extensive functions and generally adequate battery life.

While there has been a recent trend to increase the size of some of the mobile computing devices, especially in the smart phone and tablet categories, such size increases are accompanied by expectations of increased computing power and better battery life. Accordingly, there continues to be pressure to miniaturize the circuitry within the mobile computing devices. Two-dimensional (2D) integrated circuits (ICs) (2DICs) are approaching what seem to be hard physical limits in terms of material behavior as well as limits in manufacturing processes which preclude further miniaturization. The pressure to miniaturize continues unabated in view of these limits. Accordingly, circuit designers have embraced three-dimensional (3D) ICs (3DICs).

While IC manufacturing is a relatively mature industry, such manufacturing processes do not guarantee that semiconductor materials made according to the same process have precisely the same characteristics. That is, most semiconductor materials may experience process variations during the manufacturing processes. Such process variations may result in a semiconductor material that is typical (T), fast (F), or slow (S). Such variations may be different for different types of elements within a single semiconductor material. For example, an N-type Metal Oxide Semiconductor (MOS) (NMOS) field effect transistor (FET) might be fast while a P-type MOS (PMOS) FET might be slow. In the 2D context, variations between devices on a single IC are relatively uniform, and various compensation schemes (typically changing the supply voltage) for the 2DIC have been proposed. However, in a 3DIC context, different tiers of the 3DIC may have different process variations. Having different compensation requirements for different tiers imposes additional power control burdens on circuit designers, including voltage step-ups or voltage step-downs or the like. In some instances, the additional power control burdens make certain tiers unusable in certain 3DIC architectures. Such unusable tiers may be discarded, which increases manufacturing costs. Accordingly, designers would appreciate more options for power control in a 3DIC to compensate for process variations.

SUMMARY OF THE DISCLOSURE

Aspects disclosed in the detailed description include systems and methods for process variation power control in three-dimensional (3D) integrated circuits (ICs) (3DICs). In an exemplary aspect, at least one process variation sensor is placed in each tier of a 3DIC. The process variation sensors report information related to a speed characteristic for elements within the respective tier to a decision logic. The decision logic is programmed to weight output from the process variation sensors according to relative importance of logic path segments in the respective tiers. The weighted outputs are combined to generate a power control signal that is sent to a power management unit (PMU). By weighting the importance of the logic path segments, a compromise voltage may be generated by the PMU which is "good enough" for all the elements in the various tiers to provide acceptable performance. In this manner, performance may be optimized relative to a lowest acceptable power level resulting in an optimal power to performance tradeoff.

In this regard in one aspect, a method for controlling power in a 3DIC is disclosed. The method includes sensing a first speed characteristic with a first sensor in a physically embodied first tier of a 3DIC. The method also includes sensing a second speed characteristic with a second sensor in a physically embodied second tier of the 3DIC. The method includes weighting a first output from the first sensor with a first weight. The method also includes weighting a second output from the second sensor with a second weight. The method also includes combining weighted outputs from the first sensor and the second sensor. The method also includes determining a control signal for a PMU based at least in part on the combined weighted outputs.

In another aspect, a 3DIC is disclosed. The 3DIC includes a first tier. The first tier includes a first sensor configured to sense a first speed characteristic and generate a first output. The first tier also includes a first logic path segment. The 3DIC also includes a second tier. The second tier includes a second sensor configured to sense a second speed characteristic and generate a second output. The second tier also includes a second logic path segment communicatively coupled to the first logic path segment to form a logic path. The 3DIC also includes decision logic. The decision logic is configured to receive the first output from the first sensor. The decision logic is also configured to receive the second speed characteristic from the second sensor. The decision logic is also configured to weight the first output with a first weight. The decision logic is also configured to weight the second output with the second weight. The decision logic is also configured to combine weighted outputs from the first sensor and the second sensor. The decision logic is also configured to determine a control signal for a PMU based at least in part on the combined weighted outputs.

In another aspect, a 3DIC is disclosed. The 3DIC includes a first tier. The first tier includes a means to sense a first speed characteristic and generate a first output. The first tier also includes a first logic path segment. The 3DIC also includes a second tier. The second tier includes a means to sense a second speed characteristic and generate a second output. The second tier also includes a second logic path segment communicatively coupled to the first logic path segment to form a logic path. The 3DIC also includes a means to receive the first output from the means to sense the first speed characteristic, receive the second speed characteristic from the means to sense the second speed characteristic, weight the first output with a first weight, weight the second output with a second weight, combine weighted outputs from the first sensor and the second sensor, and determine a control signal for a PMU based at least in part on the combined weighted outputs.

BRIEF DESCRIPTION OF THE FIGURES

FIG. 2 is a simplified system on a chip (SoC) monolithic 3DIC that may have logic paths that extend across multiple tiers;

DETAILED DESCRIPTION

Figure 1C:
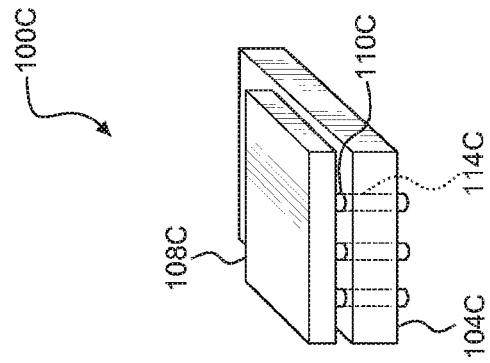
FIGS. 1A-1C illustrate three exemplary simplified system in a package (SIP) three-dimensional (3D) integrated circuit (IC) (3DIC) systems which may have logic paths that extend across multiple tiers.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for process variation power control in three-dimensional (3D) integrated circuits (ICs) (3DICs). In an exemplary aspect, at least one process variation sensor is placed in each tier of a 3DIC. The process variation sensors report information related to a speed characteristic for elements within the respective tier to a decision logic. The decision logic is programmed to weight output from the process variation sensors according to relative importance of logic path segments in the respective tiers. The weighted outputs are combined to generate a power control signal that is sent to a power management unit (PMU). By weighting the importance of the logic path segments, a compromise voltage may be generated by the PMU which is "good enough" for all the elements in the various tiers to provide acceptable performance. In this manner, performance may be optimized relative to a lowest acceptable power level resulting in an optimal power to performance tradeoff.

By providing a uniform compromise voltage, voltage level shifting may be avoided as signals pass between different tiers of the 3DIC. Likewise, a single voltage signal is possible to reduce the requirements for a timing closure strategy while at the same time allowing for some power savings relative to a solution that assumes worst case speed characteristics and supplies a higher voltage than is necessary for many tiers so that the slowest tier has an adequate voltage level.

3DICs may come in various forms, including system in a package (SIP) arrangements or monolithic 3DICs. SIP arrangements include multiple discrete ICs stacked into a package. The individual and separate ICs are preserved because of the difficulty experienced in integrating different technologies within a single IC. For example, fabrication techniques differ greatly between analog and digital components, and accordingly, it is difficult to include both components in a single IC. Likewise, fabrication techniques to support high speed circuitry are different than those techniques used to provide low current leakage, and it is difficult to include both types of components in a single IC. In short, there are many conflicting technology requirements to achieve different functions within an IC. Such different processes may cause one tier of the 3DIC to operate in a "typical" or "T" process corner and the other tier to operate in "fast" (F) or "slow" (S) process corner. More extreme process variations may cause an F tier to be combined with an S tier. Even when the IC is made through a single process, there may be process variations between ICs made at different times or on different places of the silicon wafer. When such mismatches occur, circuit designers must compensate for the mismatch. In the past, one typical approach is to over-engineer the 3DIC, assuming a worst case scenario and providing a voltage high enough to drive any element in any tier. Such over-engineering may result in excessively high voltage for some tiers and corresponding increases in power consumption. The high voltage for some tiers may mean that those tiers operate faster than other tiers, which may cause performance issues. This problem exists for SIP arrangements and monolithic 3DICs. Alternatively, differing power supplies may be provided for different tiers. Such differing power levels may require voltage level shifting as signals pass from one tier to another. Likewise, this approach requires complex timing closure strategies to cover the different process variations. Exemplary aspects of the present disclosure provide alternate solutions to such process variations. Before addressing those solutions, an overview of different sorts of 3DICs are discussed with reference to FIGS. 1A-1C and 2. A discussion of specific exemplary aspects of the present disclosure begins below with reference to FIG. 3.

Figure 1B:
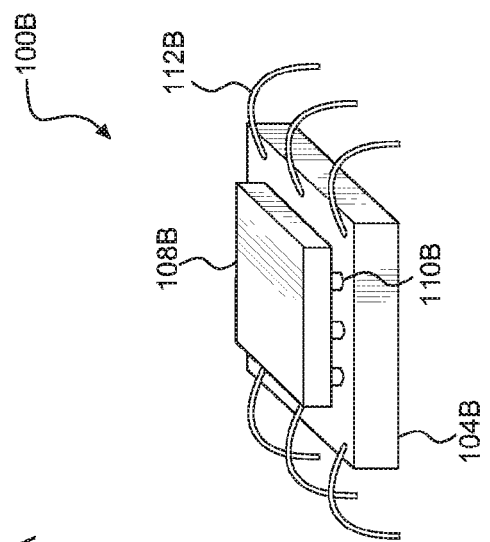
Figure 1A:
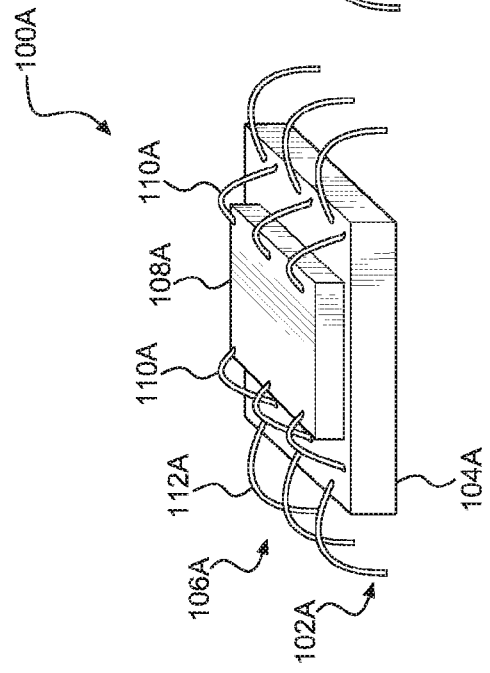

In this regard, FIG. 1A illustrates a die stacked system 100A. The die stacked system 100A has a first tier or layer 102A formed from a first IC 104A and a second tier or layer 106A formed from a second IC 108A. This arrangement is sometimes referred to as a wireless bond in that there is no direct wire connection between the first IC 104A and the second IC 108A. The first IC 104A is intercoupled to the second IC 108A with external wiring 110A. To accommodate the external wiring 110A, the second layer 106A may be smaller than the first layer 102A. Likewise, the first IC 104A is coupled to other elements within a device (not shown) by external wiring 112A. The first IC 104A may be made by a first process and the second IC 108A may be made by a second process, which may cause process variations to exist between the different tiers. Even if the ICs 104A and 108A are made by the same process, different locations on the semiconductor wafer being processed at different times may cause process variations.

With reference to FIG. 1B, die stacked system 100B is similar to the die stacked system 100A of FIG. 1A, but instead of the external wiring 110A, solder bumps 110B are used to interconnect first IC 104B with second IC 108B. This arrangement is sometimes referred to as a flip-chip arrangement. Face to face bonding is achieved, but only for two layers. If more than two layers are used, then external wiring (such as that used in FIG. 1A) is required. However, even with just two layers, external wiring 112B is still present to interconnect the die stacked system 100B to other elements within the device. The positioning of the external wiring 112B on the upper surface of the first IC 104B forces the second IC 108B to be smaller than the first IC 104B with the same disadvantages just discussed.

With reference to FIG. 1C, die stacked system 100C is likewise similar to the die stacked systems 100A and 100B of FIGS. 1A and 1B, but instead of the external wiring 110A, solder bumps 110C intercouple first IC 104C with second IC 108C. Likewise, vias 114C (which may be through silicon vias (TSV)) extend through the first IC 104C. TSV are typically fairly large (e.g. ~microns) and correspondingly impose a large area penalty as wiring within the first IC 104C must be routed around the TSV. This routing and requirements for space for active components again force first the IC 104C to be larger than the second IC 108C.

In contrast to the die stacked systems 100A-100C, a 3DIC may be a monolithic 3DIC. Thus, a single IC may be formed having heterogeneous functions across multiple tiers within the IC. Some functions may be collocated within a single tier while some functions may be spread across multiple tiers. Thus, a monolithic 3DIC allows heterogeneous partitioning of system functions in different tiers of different technologies or flavors, heterogeneously partitioning circuit functions in different tiers of different technologies or flavors, and homogeneously partitioning different functions in different tiers of different technologies or flavors. Such flexibility in partitioning may cause such partitioned functions to use tiers having different process variations. Having a logic path cross tiers as a function of such partitioning creates design challenges in providing an optimal performance and power consumption profile.

To assist in understanding such a monolithic structure, FIG. 2 illustrates a simplified cross-section of a monolithic 3DIC 200. The monolithic 3DIC 200 has multiple tiers 202. The tiers 202 may be formed by hydrogen cutting or other monolithic tier formation method.

As noted above, the use of 3DIC technology allows different tiers of the tiers 202 within the monolithic 3DIC 200 to perform different functions and provide all the functions of a particular device in a single IC. For example, the monolithic 3DIC 200 may be a radio frequency (RF) transceiver and controller for a mobile terminal such as a smart phone or tablet. Thus, a first tier 204 includes sensors and other large feature size elements.

With continued reference to FIG. 2, a second tier 206 may include RF, analog, and/or power management integrated circuit (PMIC) components such as a receiver, a transmitter, and a duplexer/switch. The second tier 206 may be designed to be relatively low noise so that incoming RF analog signals are not distorted.

With continued reference to FIG. 2, an electromagnetic (EM) shield 208 may be positioned between the second tier 206 and a third tier 210. The EM shield 208 may be formed from a conductive material, such as a graphene layer.

The presence of the EM shield 208 helps prevent noise from the first and second tiers 204 and 206 from affecting the low noise characteristics of the third tier 210. The third tier 210 may have a modem or other controller. To accommodate the functions on the third tier 210, the materials and design of the third tier 210 may be selected to promote a medium speed architecture.

With continued reference to FIG. 2, fourth and fifth tiers 212 and 214 may be a memory bitcell array with random access memory (RAM) including dynamic RAM (DRAM), static RAM (SRAM) or the like. Both of the fourth and fifth tiers 212 and 214 may be designed to provide low leakage circuitry to improve the operation of the RAM.

With continued reference to FIG. 2, sixth and seventh tiers 216 and 218 may be general processing unit tiers. The sixth tier 216 may include a digital signal processor (DSP), such as a baseband processor using combination logic, while the seventh tier 218 may include a DSP relying on sequential logic. Both of the sixth and seventh tiers 216 and 218 may be designed to support high speeds over concerns about leakage.

In an exemplary embodiment, the tiers 202 are electrically intercoupled by monolithic intertier via (MIV) 220. For more information about MIV, the interested reader is referred to "High-Density Integration of Functional Modules Using Monolithic 3D-IC Technology" by Shreedpad Panth et al. in the proceedings of the IEEE/ACM Asia South Pacific Design Automation Conference, 2013; pp. 681-686, which is hereby incorporated by reference in its entirety. In contrast to TSV, MIV may be on the order of sub 100 nanometers (nm) in diameter (i.e., much smaller than the micron dimensions of the TSV) and 200 nm or less depth. Further, in an exemplary embodiment, each of the multiple tiers 202 may be approximately 400 nm thick or thinner. These dimensions are illustrated in the inset of FIG. 2.

By providing different tiers with different functions and/or being able to split circuits across different tiers, a full system IC is possible including batteries, sensors, memory, energy harvesting functions, PMIC, processors, digital and analog components, and the like. Each tier may be optimized to accommodate the functions positioned thereon. Additionally, the very high density of tier to tier links (i.e., the MIV) allows a high degree of wafer level integration. The monolithic 3DIC may have a homogeneous cell level 3D partition—sequential-combination logic, multi-tier memory bitcell arrays. Likewise, the monolithic 3DIC may have a fine grain heterogeneous 3D partition such as a memory to digital core, bitcell array-control logic partitions. This flexibility allows for a wide range of technology features for optimal system functions. However, as noted, this flexibility may introduce process variations between tiers over and above any process variations that may exist within a single tier.

Figure 3:
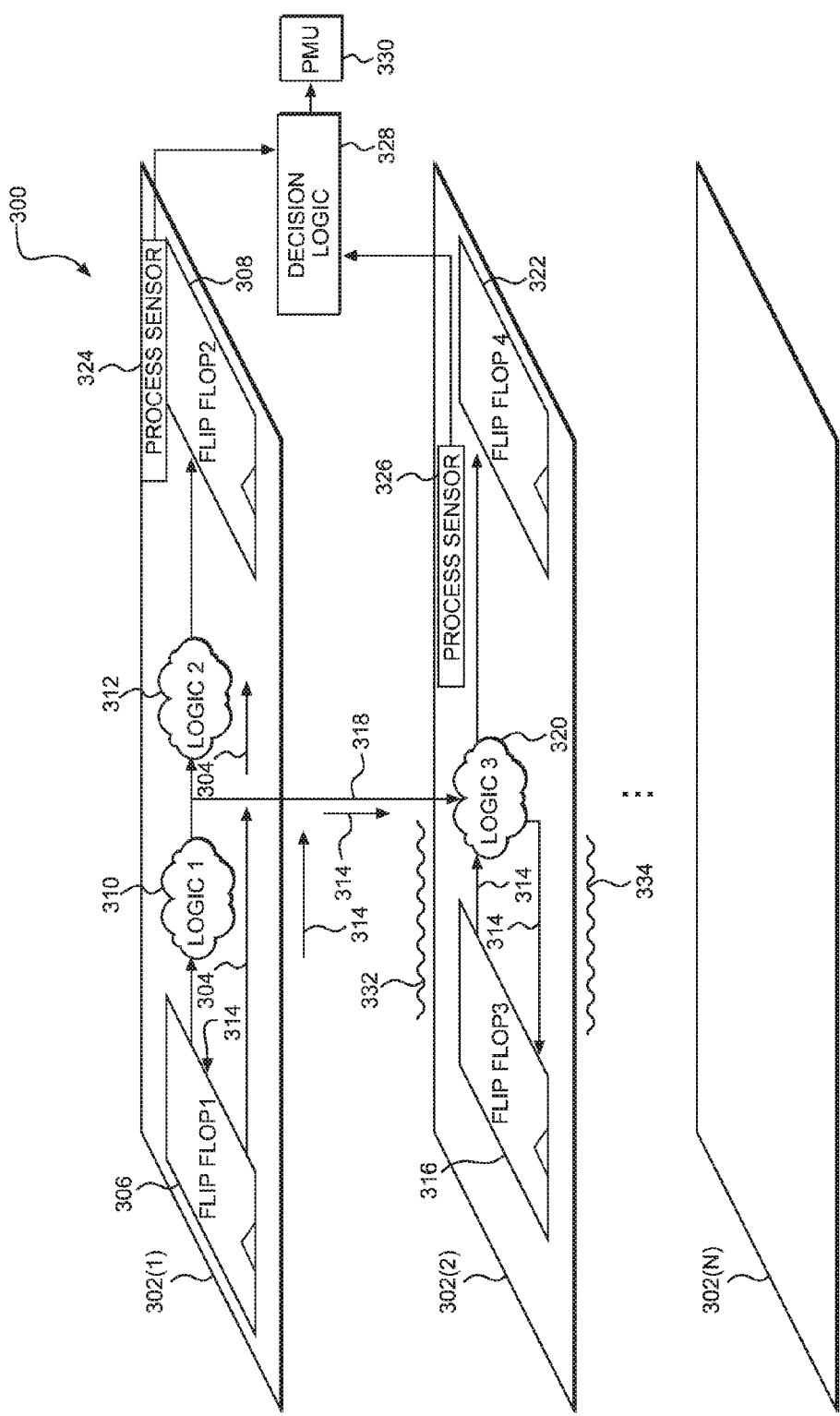
FIG. 3 is a simplified view of two tiers of a 3DIC with a logic path extending across both tiers and separate process sensors in each tier.

Within the 3DICs 100A-100C and 200, there may be logic paths that span multiple tiers. A simplified block diagram of such logic paths is presented in FIG. 3. In particular, FIG. 3 illustrates a partial 3DIC 300 that has multiple tiers 302(1)-302(N). For simplicity, only two tiers 302(1) and 302(2) will be addressed, but it should be appreciated that the concepts discussed relative to the two tiers 302(1) and 302(2) are applicable to more tiers or different tiers 302(P)-302(N) (where 2<P<N) within the partial 3DIC 300. A first logic path 304 exists between a first flip-flop 306 and a second flip-flop 308 through a first logic 310 and a second logic 312. The entirety of the first logic path 304 lies in the first tier 302(1). A second logic path 314 exists between the first flip-flop 306 and a third flip-flop 316 through the first logic 310, down via 318 and through third logic 320. The second logic path 314 spans the two tiers 302(1) and 302(2). Still other logic paths (not labeled) may exist between the first flip-flop 306 and a fourth flip-flop 322, between the second flip-flop 308 and the third flip-flop 316 or the fourth flip-flop 322, between the third flip-flop 316 and the fourth flip-flop 322, or the like.

With continued reference to FIG. 3, the first tier 302(1) further includes a process sensor 324, and the second tier 302(2) further includes a process sensor 326. Such process sensors are sometimes referred to as a means to sense speed characteristics. In an exemplary aspect, the process sensor 324 and the process sensor 326 are ring oscillators. The process sensor 324 and the process sensor 326 are communicatively coupled to a decision logic 328 that may be located on any of the tiers 302(1)-302(N) of the partial 3DIC 300 or outside the partial 3DIC 300 (on another tier not illustrated or completely separate from the 3DIC). The decision logic 328 sends a control signal to a PMU 330, which in turn provides power to the partial 3DIC 300. The process sensors 324 and 326 provide an indication of a speed characteristic associated with the respective tiers 302(1) and 302(2) to the decision logic 328. For example, if the first tier 302(1) is a fast tier, an indication of this fast speed characteristic is provided to the decision logic 328. In the example where the process sensors 324 and 326 are ring oscillators, the indication of the speed characteristic may be a frequency count. The decision logic 328 may use the indication of the speed characteristic to determine a control signal to send to the PMU 330. In particular, the decision logic 328 may weight the frequency count according to an algorithm explained below. In general, tiers within the tiers 302(1)-302(N) having more important logic paths are weighted more heavily than tiers having less important logic paths. Where a logic path has a first segment in a first tier, such as first segment 332 of the second logic path 314 in the first tier 302(1) and a second segment in a second tier, such as second segment 334 of the second logic path 314 in the second tier 302(2), the size of the segment relative to the entire length of the logic path may be used to modify the weight given to a particular tier. Based on the combination of weighted indications of speed characteristics, the decision logic 328 may select a power level that is "good enough" to support all the tiers while still having an acceptable performance profile. In this manner a single voltage may be supplied obviating the need for voltage level shifters or complex timing closure strategies. Likewise, the power impact to drive the slower tiers is not so onerous as to make the slower tiers unusable.

As used herein the decision logic 328 (or other decision logics described below) are sometimes referred to as a means to receive the first output from a process sensor, a means to receive the second output from a process sensor; a means to weight the first output with a first weight, a means to weight the second output with a second weight, combine the weights and determine a control signal.

Figure 4:
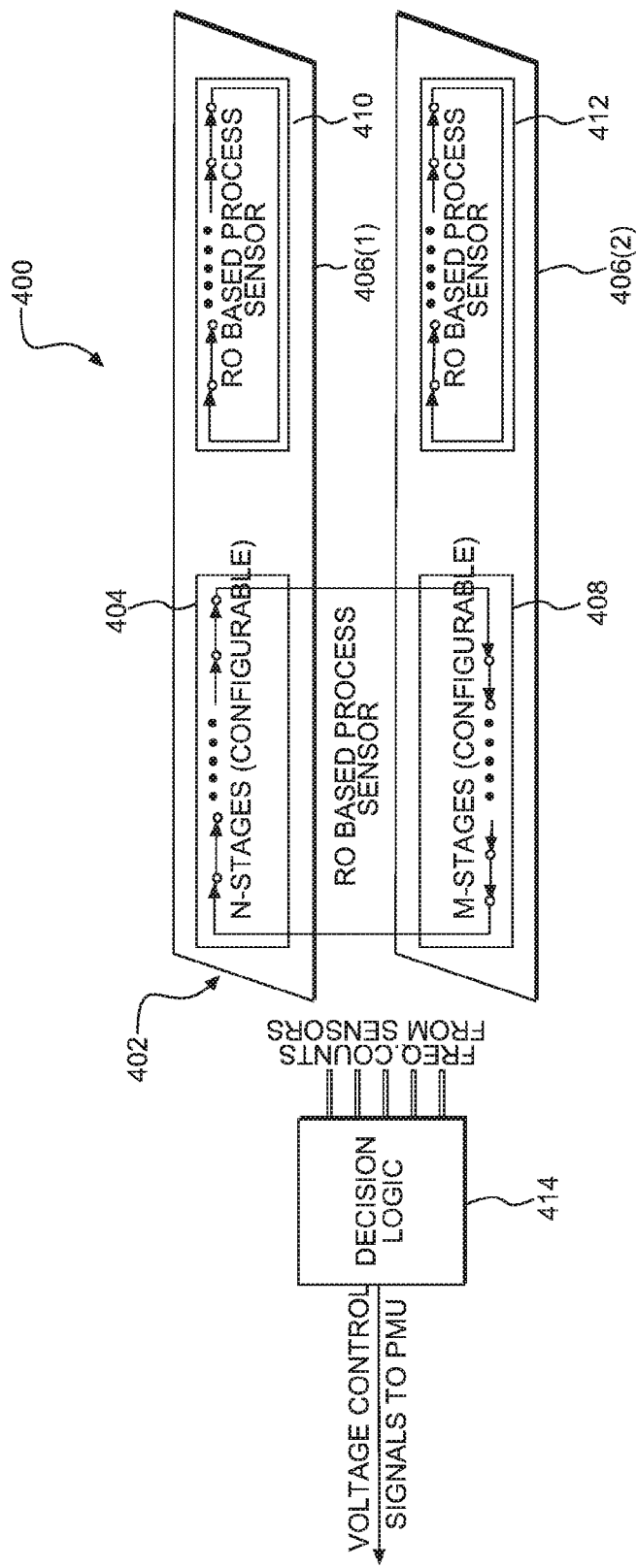
FIG. 4 is a simplified view of two tiers of a 3DIC with a process sensor spanning both tiers as well as separate process sensors in each tier.

In another exemplary aspect, a partial 3DIC 400, illustrated in FIG. 4, may have a process sensor 402 that includes a first sensor portion 404 that is present in a first tier 406(1) and a second sensor portion 408 that is present in a second tier 406(2). The first sensor portion 404 is coupled to the second sensor portion 408. The first tier 406(1) may further include a second process sensor 410 that exists solely within the first tier 406(1). Likewise, the second tier 406(2) may further include a third process sensor 412 that exists solely within the second tier 406(2). As with the partial 3DIC 300 of FIG. 3, the process sensors 402, 410, and 412 are communicatively coupled to a decision logic 414, which in turn provides a power control signal to a PMU (not illustrated). As with the partial 3DIC 300, the outputs of the process sensors 402, 410, and 412 are weighted and combined to determine the power control signal. Given the greater granularity of the multiple sensors and the fact that the process sensor 402 conveys information about both of the tiers 406(1) and 406(2), the weighting may assume greater granularity. For example, the weight assigned to output from the second process sensor 410 may be associated with how important the logic paths that lie strictly in the first tier 406(1) are. Likewise, the weight assigned to output from the third process sensor 412 may be associated with how important the logic paths that lie strictly in the second tier 406(2) are. Still further, output of the process sensor 402 may be weighed according to how important the logic paths that have segments in both the first tier 406(1) and the second tier 406(2) are. In an exemplary aspect, the process sensors 402, 410, and 412 are ring oscillators and provide an indication of a speed characteristic in the form of a frequency count to the decision logic 414. In the example where the process sensor 402 is a ring oscillator, preliminary weighting of the frequency count may be achieved by configuring a number of stages (N) in the first sensor portion 404 relative to a number (M) of stages in the second sensor portion 408. That is, an appropriate number of stages is provided in each tier to create a sensor that tracks critical path behavior for a logic path that spans between the first tier 406(1) and the second tier 406(2). In an exemplary aspect, more stages are provided for more important tiers. In another exemplary aspect, more stages are provided for tiers with longer segments. Still other ways of weighting the relative count between tiers may also be used without departing from the present disclosure. In an exemplary aspect, the ring oscillators are formed from inverters. In other exemplary aspects, the ring oscillators are formed from Negative AND (NAND) or Negative OR (NOR), or some combination of the two logic types.

Figure 5:
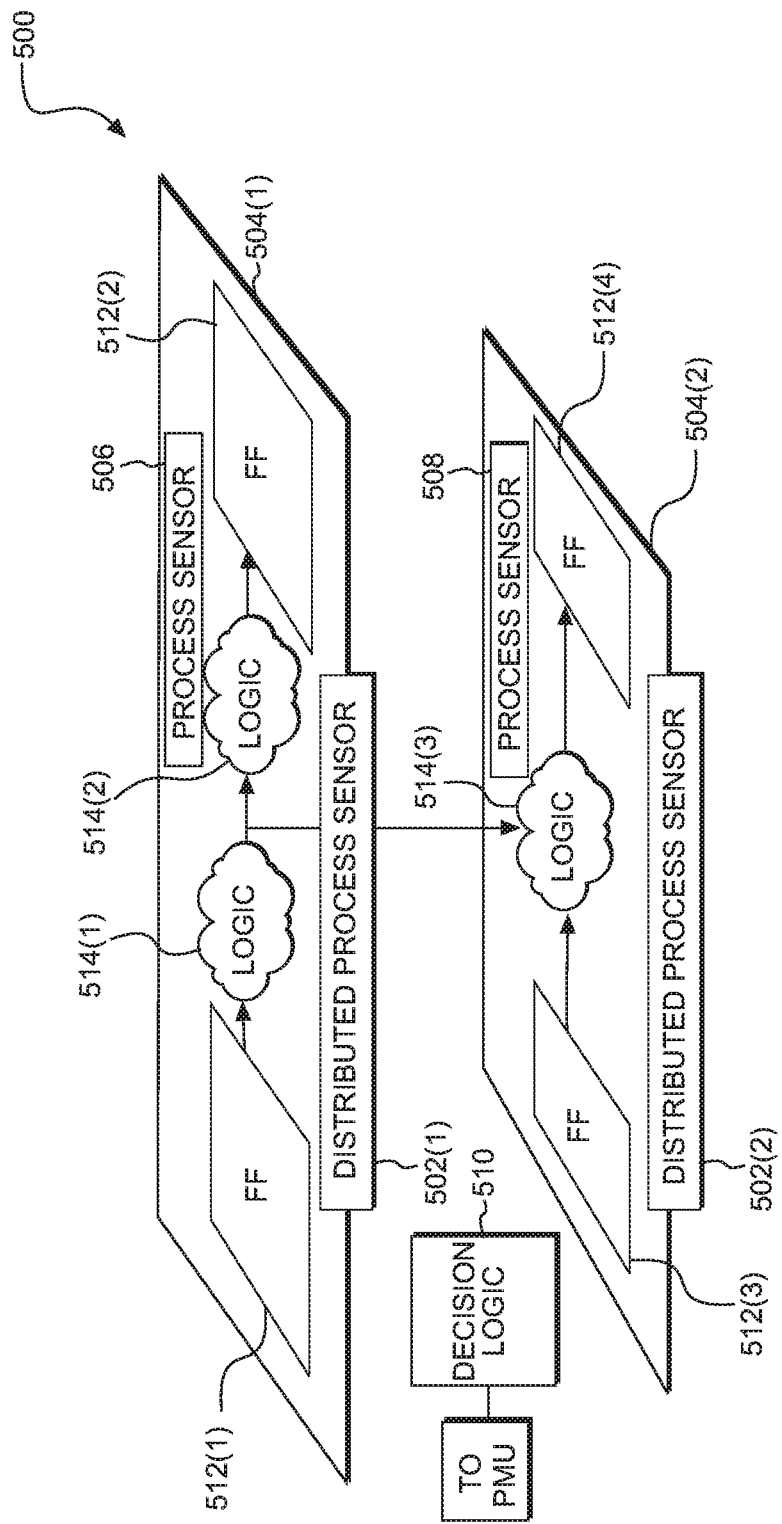
FIG. 5 is simplified view of two tiers of a 3DIC with a distributed process sensor as well as separate process sensors in each tier.

In another exemplary aspect, a partial 3DIC 500, illustrated in FIG. 5, may have a first process sensor 502(1) in a first tier 504(1) and a second process sensor 502(2) in a second tier 504(2). Collectively, the first process sensor 502(1) and the second process sensor 502(2) form a distributed process sensor. Still further, the first tier 504(1) may include a process sensor 506 that is not part of the distributed process sensor and exists solely within the first tier 504(1). The second tier 504(2) may include a process sensor 508 that is not part of the distributed process sensor and exists solely within the second tier 504(2). The process sensors 502(1), 502(2), 506, and 508 are communicatively coupled to a decision logic 510 and provide information related to a speed characteristic for the respective tiers 504(1) and 504(2) as well as information about both of the tiers 504(1) and 504(2) in the case of the distributed process sensor formed from the process sensors 502(1) and 502(2). Logic paths may be formed between flip-flops 512(1)-512(4) (referenced in the drawings as "FF") and logic elements 514 (1)-514(3). As with the partial 3DIC 400 of FIG. 4, the decision logic 510 weights outputs from the process sensors 502(1), 502(2), 506, and 508 and combines the weighted outputs to generate the power control signal. The weight assigned to output from the process sensor 506 may be associated with how important the logic paths that lie strictly in the first tier 504(1) are. Likewise, the weight assigned to output from the process sensor 508 may be associated with how important the logic paths that lie strictly in the second tier 504(2) are. Still further, output of the distributed process sensor formed from the process sensors 502(1) and 502(2) may be weighed according to how important the logic paths that have segments in both first tier 504(1) and the second tier 504(2) are.

Against the possible 3DIC structures described above, FIG. 6 provides a flowchart for determining the weighting to be assigned to outputs from process sensors. Process 600 of FIG. 6 assumes that the process sensors are ring oscillators and that the output is a frequency count. Other algorithms may be created for process sensors that generate different outputs. Returning to the process 600, the process starts (block 602). Initially, the designer identifies Tier_Groups for each critical logic path (block 604). That is, while there are numerous logic paths, some may be so inconsequential that impacts thereto from process variations may not affect the overall operation noticeably. Accordingly, only the critical logic paths are identified and corresponding tiers identified. It should be appreciated that tiers with critical logic paths confined to just one tier will be the lone member in that group. The weight of this group is one ($W_n=1$). In contrast, each set of tiers with critical logic paths distributed between them form separate groups. The sum of the weights within each Tier_Group will add up to one ($\Sigma W_n$).

Figure 6:
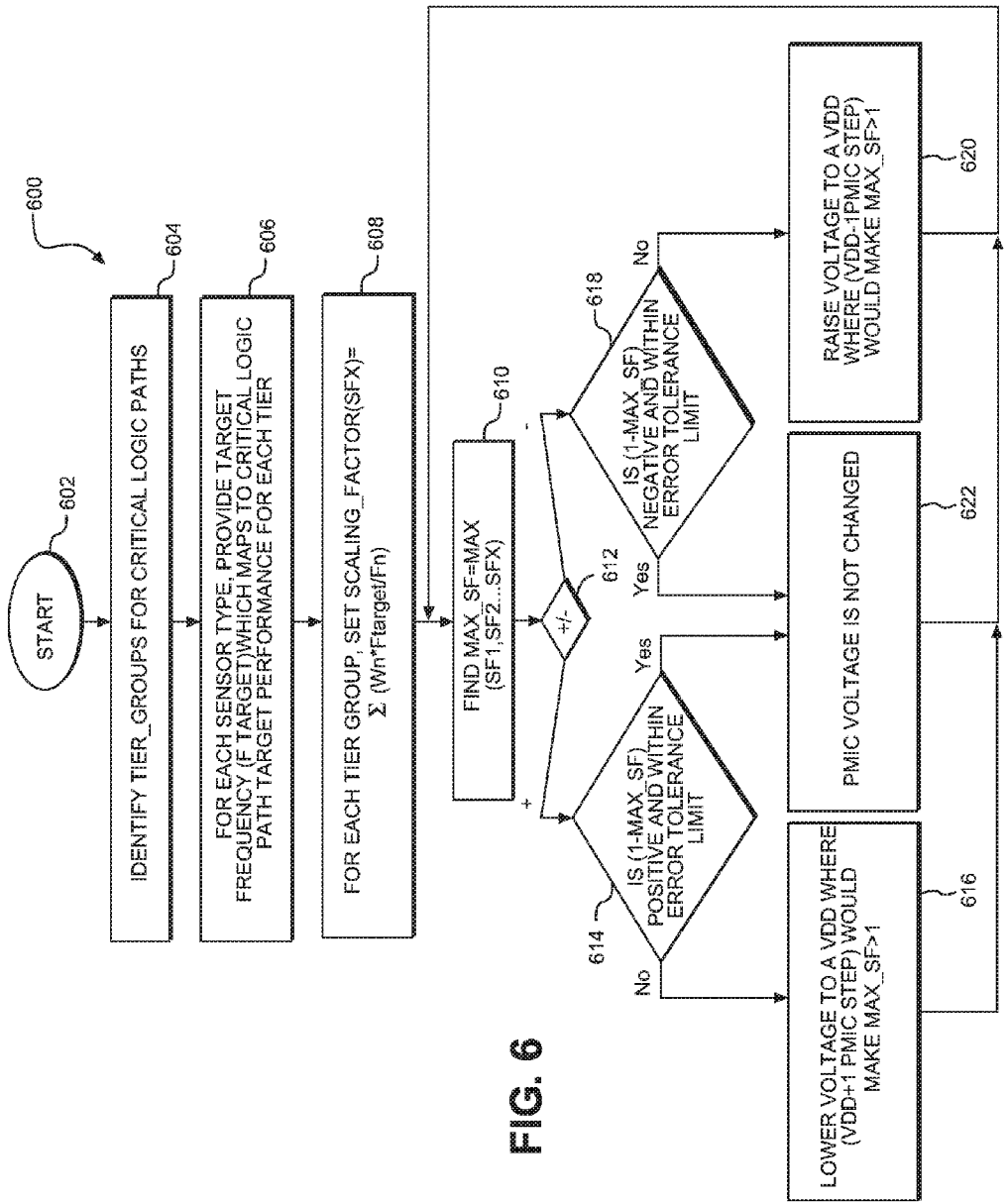
FIG. 6 is a flowchart illustrating an exemplary process for using process sensors to determine an optimal power control signal.

With continued reference to FIG. 6, the process 600 continues. For each sensor type (distributed, multi-tier, single tier), the designer provides a target frequency ($F_{Target}$) which maps to the critical logic path target performance for each tier (block 606) assuming nominal voltage, Typical-Typical process variation, and nominal temperature (25° C.). For each tier group, the decision logic sets a Scaling_Factor according to the formula $$SF_x = \Sigma \frac{W_n * F_{Target}}{F_n}$$

(block 608). Note that $SF_x$ looks like a two dimensional (2D) solution when the critical logic path is confined to a single tier. The process 600 continues by finding the maximum scaling factor (i.e., Max_SF=Max {$SF_1$, $SF_2$, . . . $SF_x$} (block 610).

The decision logic then determines if 1–Max_SF is positive or negative (block 612). If 1–Max_SF is positive, the decision logic determines if this value is within an error tolerance limit (block 614). If the answer to block 614 is no, then the decision logic lowers the voltage to a VDD where VDD+1 PMIC step makes Max_SF>1 (block 616) and the process 600 returns to block 610. For the sake of example, one PMIC step may be around 10-12.5 mV. The value of the PMIC step may be programmable. If the answer to block 612 is that the value is negative, the decision logic determines if the value is within an error tolerance limit (block 618). If the answer to bock 618 is no, then the decision logic raises the voltage to a VDD where VDD-1 PMIC step makes Max_SF>1 (block 620) and the process returns to block 610. Note that the goal of the incrementing and decrementing of the VDD by a PMIC step is to get 1–Max_SF as close to zero as possible, but still positive.

With continued reference to FIG. 6, if either block 614 or block 618 is answered affirmatively, the PMIC voltage remains unchanged (block 622) and the process continues to monitor the outputs from the sensors.

An example of the process 600 is provided in Table 1 below where a single logic path is distributed between three tiers.

TABLE 1

| Tier | Weight | $F_{TARGET}$ | $F_n$ | $Wn*F_{TARGET}/F_n$ | corner |
|---|---|---|---|---|---|
| 1 | 0.3 | 100 | 125 | 0.24 | FF |
| 2 | 0.6 | 100 | 75 | 0.80 | SS |
| 3 | 0.1 | 100 | 100 | 0.10 | TT |

[max (1.14)] = 1.14

Another example of the process 600 is provided in table 2 below where there are two paths. One is confined to a single tier and one is distributed across two tiers. TG is the Tier_Group.

TABLE 2

| Tier | TG | Weight | $F_{TARGET}$ | $F_n$ | $Wn*F_{TARGET}/F_n$ | corner |
|---|---|---|---|---|---|---|
| 1 | 1 | 1 | 100 | 125 | 0.80 | FF |
| 2 | 2 | 0.3 | 100 | 125 | 0.24 | FF |
| 3 | 2 | 0.7 | 100 | 100 | 0.70 | TT |

[max (0.80, 0.94)] = 0.94

The systems and methods for process variation power control in 3DICs according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
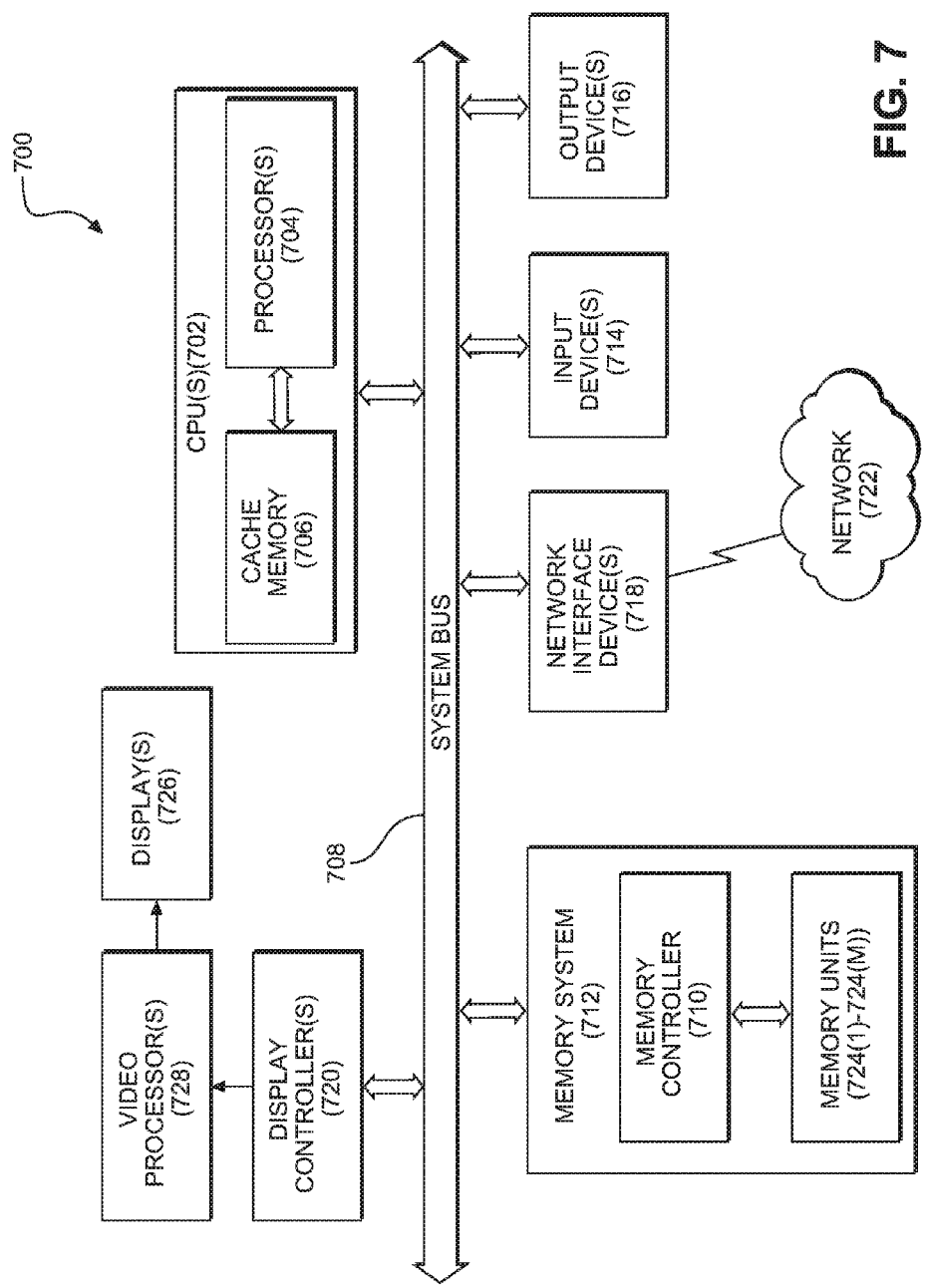
FIG. 7 is a block diagram of an exemplary processor-based system that can include the 3DIC systems of FIGS. 1A-1C and 2.

In this regard, FIG. 7 illustrates an example of a processor-based system 700 that can employ the 3DIC systems 100A-100C and 200 illustrated in FIGS. 1A-1C and 2. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any devices configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0-N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a DSP, an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in RAM, flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for controlling power in a three-dimensional (3D) integrated circuit (IC) (3DIC), the method comprising:
    sensing a first speed characteristic with a first sensor in a physically embodied first tier of a 3DIC;
    sensing a second speed characteristic with a second sensor in a physically embodied second tier of the 3DIC;
    weighting a first output from the first sensor with a first weight;
    weighting a second output from the second sensor with a second weight;
    combining weighted outputs from the first sensor and the second sensor; and
    determining a control signal for a power management unit (PMU) based at least in part on the combined weighted outputs.

2. The method of claim 1, wherein sensing the first speed characteristic with the first sensor comprises sensing voltage and temperature with the first sensor.

3. The method of claim 1, wherein sensing the first speed characteristic with the first sensor comprises sensing the first speed characteristic with a ring oscillator.

4. The method of claim 1, wherein weighting the first output comprises weighting a first frequency count.

5. The method of claim 1, further comprising sensing a third speed characteristic for the physically embodied first tier of the 3DIC using a third sensor.

6. The method of claim 1, wherein the first weight is based on a first logic path segment located in the first tier.

7. The method of claim 6, wherein the second weight is based on a second logic path segment located in the second tier.

8. The method of claim 1, further comprising sensing, using a multi-tier sensor, a multi-tier speed characteristic and using the multi-tier speed characteristic in determining the control signal.

9. The method of claim 1, further comprising outputting the control signal to the PMU.

10. The method of claim 9, further comprising generating a voltage level with the PMU.

11. A three-dimensional (3D) integrated circuit (IC) (3DIC), comprising:
    a first tier comprising:
        a first sensor configured to sense a first speed characteristic and generate a first output; and
        a first logic path segment;
    a second tier comprising:
        a second sensor configured to sense a second speed characteristic and generate a second output; and
        a second logic path segment communicatively coupled to the first logic path segment to form a logic path; and
    decision logic configured to:
        receive the first output from the first sensor;
        receive the second speed characteristic from the second sensor;
        weight the first output with a first weight;
        weight the second output with a second weight;

combine weighted outputs from the first sensor and the second sensor; and determine a control signal for a power management unit (PMU) based at least in part on the combined weighted outputs.

12. The 3DIC of claim 11, wherein the first sensor is further configured to sense voltage and temperature.

13. The 3DIC of claim 11, wherein the first sensor comprises a ring oscillator.

14. The 3DIC of claim 11, wherein the first sensor is configured to generate a first frequency count as the first output.

15. The 3DIC of claim 11, further comprising a third sensor positioned in the first tier, the third sensor configured to:
sense a third speed characteristic;
generate a third output; and
provide the third output to the decision logic.

16. The 3DIC of claim 11, wherein the first weight is based on the first logic path segment.

17. The 3DIC of claim 16, wherein the second weight is based on the second logic path segment.

18. The 3DIC of claim 11, further comprising a multi-tier sensor positioned at least in part on both the first tier and the second tier, the multi-tier sensor configured to sense a multi-tier speed characteristic and generate a multi-tier output and provide the multi-tier output to the decision logic.

19. The 3DIC of claim 11 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

20. A three-dimensional (3D) integrated circuit (IC) (3DIC), comprising:
a first tier comprising:
a means to sense a first speed characteristic and generate a first output; and
a first logic path segment;
a second tier comprising:
a means to sense a second speed characteristic and generate a second output; and
a second logic path segment communicatively coupled to the first logic path segment to form a logic path; and
a means to:
receive the first output from the means to sense the first speed characteristic;
receive the second output from the means to sense the second speed characteristic;
weight the first output with a first weight;
weight the second output with a second weight;
combine weighted outputs from the first sensor and the second sensor; and
determine a control signal for a power management unit (PMU) based at least in part on the combined weighted outputs.

* * * * *